(12) United States Patent
Tian et al.

(10) Patent No.: US 11,302,761 B2
(45) Date of Patent: Apr. 12, 2022

(54) DISPLAY SUBSTRATE ASSEMBLY AND METHOD OF MANUFACTURING THE SAME, AND DISPLAY APPARATUS

(71) Applicant: BOE Technology Group Co., Ltd., Beijing (CN)

(72) Inventors: Xueyan Tian, Beijing (CN); Caiyu Qu, Beijing (CN); Zheng Liu, Beijing (CN); Xinshe Yin, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 4 days.

(21) Appl. No.: 16/631,002

(22) PCT Filed: Jul. 25, 2019

(86) PCT No.: PCT/CN2019/097710
§ 371 (c)(1),
(2) Date: Jan. 14, 2020

(87) PCT Pub. No.: WO2020/020294
PCT Pub. Date: Jan. 30, 2020

(65) Prior Publication Data
US 2020/0388662 A1 Dec. 10, 2020

(30) Foreign Application Priority Data
Jul. 27, 2018 (CN) .......................... 201810839868.9

(51) Int. Cl.
*H01L 27/32* (2006.01)
*H01L 21/02* (2006.01)
*H01L 29/06* (2006.01)

(52) U.S. Cl.
CPC .... *H01L 27/3272* (2013.01); *H01L 21/02675* (2013.01); *H01L 29/06* (2013.01); *H01L 27/3227* (2013.01)

(58) Field of Classification Search
CPC ........... H01L 27/3272; H01L 21/02675; H01L 27/3227; H01L 29/78633; H01L 27/3262; H01L 51/0014; H01L 51/56; H01L 29/06
See application file for complete search history.

(56) References Cited

U.S. PATENT DOCUMENTS 10,204,934 B2   2/2019  Tian et al.
2005/0227459 A1* 10/2005 Takahashi ......... H01L 21/02381
                                                    438/486
(Continued)

FOREIGN PATENT DOCUMENTS

CN   101355090 A   1/2009
CN   104617104 A   5/2015
(Continued)

OTHER PUBLICATIONS

First Office Action, including Search Report, for Chinese Patent Application No. 201810839868.9, dated Mar. 16, 2020, 15 pages.

*Primary Examiner* — S M Sohel Imtiaz
(74) *Attorney, Agent, or Firm* — Westman, Champlin & Koehler, P.A.

(57) ABSTRACT

In an embodiment, there is provided a display substrate assembly. The display substrate assembly includes: a base substrate; a light-shielding layer on the base substrate, the light-shielding layer having a plurality of light-shielding elements; and a plurality of polysilicon layers respectively on sides of the plurality of light-shielding elements away from the base substrate; wherein the plurality of light-shielding elements have different sizes such that energy lights reflected and/or refracted through the plurality of light-shielding elements of different sizes respectively generate different thermal energy distributions on the plurality of polysilicon layers corresponding to the plurality of light-shielding elements, causing the plurality of polysilicon layers to have different crystal forms. Meanwhile, a method
(Continued)

of manufacturing the display substrate assembly and a display apparatus including the aforementioned display substrate assembly are also provided.

14 Claims, 7 Drawing Sheets

(56) References Cited

U.S. PATENT DOCUMENTS

| | | | |
|---|---|---|---|
| 2010/0051950 A1* | 3/2010 | Sun | H01L 21/02532 257/59 |
| 2010/0148192 A1* | 6/2010 | Jung | H01L 51/5284 257/88 |
| 2016/0315197 A1* | 10/2016 | Liu | H01L 29/78678 |
| 2017/0277316 A1 | 9/2017 | Teranishi et al. | |
| 2018/0069068 A1* | 3/2018 | Ka | H01L 27/1225 |
| 2018/0090521 A1 | 3/2018 | Tian et al. | |
| 2018/0145094 A1* | 5/2018 | Yan | H01L 29/78633 |
| 2018/0211088 A1* | 7/2018 | Cho | H01L 27/3272 |
| 2019/0006429 A1* | 1/2019 | Ota | H01L 51/5281 |
| 2019/0383666 A1* | 12/2019 | Kakimoto | G01J 5/026 |

FOREIGN PATENT DOCUMENTS

| | | | | |
|---|---|---|---|---|
| CN | 105470196 A | | 4/2016 | |
| CN | 106847825 A | | 6/2017 | |
| CN | 107123664 A | | 9/2017 | |
| CN | 107256869 A | * | 10/2017 | ............. H01L 27/12 |
| CN | 108962957 A | | 12/2018 | |

* cited by examiner

DISPLAY SUBSTRATE ASSEMBLY AND METHOD OF MANUFACTURING THE SAME, AND DISPLAY APPARATUS

CROSS-REFERENCE TO RELATED APPLICATION

This application is a Section 371 National Stage application of International Application No. PCT/CN2019/097710, filed on Jul. 25, 2019, which has not yet published, and claims priority to Chinese Patent Application No. 201810839868.9 filed on Jul. 27, 2018 in the State Intellectual Property Office of China, the disclosures of which are hereby incorporated by reference in their entireties.

TECHNICAL FIELD

The present disclosure relates to the field of display technology, and particularly, to a display substrate assembly and a method of manufacturing the same, and a display apparatus.

BACKGROUND

Active Matrix Organic Light Emitting Diode (AMOLED for short) display apparatus has the advantages of high picture quality, low power consumption, wide viewing angle, ultra-lightness, ultra-thinness, short response time, etc., making it the optimal choice for future display technology.

The main display component of an AMOLED display apparatus is an AMOLED display substrate assembly. The AMOLED display substrate assembly includes a base substrate, and the base substrate has a display region, a gate drive circuit region and a source drive circuit region, the display region is used for provision of a display element, and the gate drive circuit region is used for provision of a gate drive circuit, and the source drive circuit region is used for provision of a source drive circuit. The display element, the gate drive circuit and the source drive circuit each include a Thin Film Transistor (TFT for short), and the TFT includes a gate, a gate insulating layer, a polysilicon layer and source and drain layers disposed in sequence. At present, when forming the polysilicon layer of the TFT, an amorphous silicon can be deposited on the gate insulating layer, and then an Excimer Laser Annealing (ELA for short) process is used to anneal the amorphous silicon to obtain polysilicon, after that, a patterning process is performed on the polysilicon to obtain a polysilicon layer of each TFT. In the polysilicon layer formed by this method, the polysilicon layer of the display element, the polysilicon layer of the gate drive circuit and the polysilicon layer of the source drive circuit have the same crystal form.

However, the gate drive circuit and the source drive circuit have different requirements on the crystal form of the polysilicon layer of the TFT. In the polysilicon layer formed by the above method, the crystal form of the polysilicon layer of the gate drive circuit is the same as that of the polysilicon layer of the source drive circuit. Accordingly, the polysilicon layer formed by the above method is difficult to meet the requirements of the gate drive circuit and source drive circuit on the TFT.

SUMMARY

According to an aspect of the present disclosure, there is provided a display substrate assembly including:

a base substrate;

a light-shielding layer on the base substrate, the light-shielding layer having a plurality of light-shielding elements; and a plurality of polysilicon layers respectively on sides of the plurality of light-shielding elements away from the base substrate;

wherein the plurality of light-shielding elements have different sizes such that energy lights reflected and/or refracted through the plurality of light-shielding elements of different sizes respectively generate different thermal energy distributions on the plurality of polysilicon layers corresponding to the plurality of light-shielding elements, causing the plurality of polysilicon layers to have different crystal forms.

In some embodiments, the plurality of light-shielding elements include a first light-shielding element and a second light-shielding element, and the plurality of polysilicon layers include a first polysilicon layer on the first light-shielding element and a second polysilicon layer on the second light-shielding element; and size of the first light-shielding element is different from size of the second light-shielding element, and crystal form of the first polysilicon layer is different from crystal form of the second polysilicon layer.

In some embodiments, the plurality of light-shielding elements further include a third light-shielding element, and the plurality of polysilicon layers further include a third polysilicon layer on the third light-shielding element; and size of the third light-shielding element is different from the size of the first light-shielding element, and crystal form of the third polysilicon layer is different from the crystal form of the first polysilicon layer.

In some embodiments, the size of the first light-shielding element is equal to or less than 5 microns, and the size of the second light-shielding element and the size of the third light-shielding element are both greater than 5 microns.

In some embodiments, the crystal form of the first polysilicon layer is a hexagonal crystal form, and the crystal form of the second polysilicon layer and the crystal form of the third polysilicon layer are both tetragonal crystal form.

In some embodiments, the first light-shielding element and the second light-shielding element are light-shielding blocks or light-shielding holes, and the third light-shielding element is light-shielding block.

In some embodiments, a buffer layer between the light-shielding layer and the plurality of polysilicon layers, or between the base substrate and the plurality of polysilicon layers.

In some embodiments, the base substrate has a display region for provision of a display element and a peripheral region for provision of a drive circuit, the peripheral region being located at least at a side of the display region; and the peripheral region contains the first polysilicon layer and the second polysilicon layer therein, and the display region contains the second polysilicon layer therein.

In some embodiments, the peripheral region further includes: a gate drive circuit sub-region for provision of a gate drive circuit, and a source drive circuit sub-region for provision of a source drive circuit; and the gate drive circuit sub-region contains the first polysilicon layer therein, and the source drive circuit sub-region contains the second polysilicon layer therein.

In some embodiments, the display region further includes: an infrared sensing sub-region for provision of an infrared sensor; and the third polysilicon layer is in the infrared sensing sub-region.

According to another aspect of the present disclosure, there is provided a method of manufacturing a display substrate assembly, the method including:

providing a base substrate;

forming a light-shielding layer on the base substrate, the light-shielding layer having a plurality of light-shielding elements; and forming a plurality of polysilicon layers respectively on sides of the plurality of light-shielding elements away from the base substrate;

wherein the plurality of light-shielding elements have different sizes such that energy lights reflected and/or refracted through the plurality of light-shielding elements of different sizes respectively generate different thermal energy distributions on the plurality of polysilicon layers corresponding to the plurality of light-shielding elements, causing the plurality of polysilicon layers to have different crystal forms.

In some embodiments, the plurality of light-shielding elements include a first light-shielding element and a second light-shielding element, and the plurality of polysilicon layers include a first polysilicon layer on the first light-shielding element and a second polysilicon layer on the second light-shielding element; and size of the first light-shielding element is different from size of the second light-shielding element, and crystal form of the first polysilicon layer is different from crystal form of the second polysilicon layer.

In some embodiments, the plurality of light-shielding elements further include a third light-shielding element, and the plurality of polysilicon layers further include a third polysilicon layer on the third light-shielding element; and size of the third light-shielding element is different from the size of the first light-shielding element, and crystal form of the third polysilicon layer is different from the crystal form of the first polysilicon layer.

In some embodiments, the size of the first light-shielding element is equal to or less than 5 microns, and the size of the second light-shielding element and the size of the third light-shielding element are greater than 5 microns.

In some embodiments, the crystal form of the first polysilicon layer is a hexagonal crystal form, and the crystal form of the second polysilicon layer and the crystal form of the third polysilicon layer are tetragonal crystal forms.

In some embodiments, the first light-shielding element and the second light-shielding element are light-shielding blocks or light-shielding holes, and the third light-shielding element is light-shielding block.

In some embodiments, the method further includes:

forming, prior to forming the plurality of polysilicon layers respectively on the plurality of light-shielding elements, a buffer layer on the base substrate formed with the light-shielding layer; or forming, prior to forming the light-shielding layer on the base substrate, the buffer layer on the base substrate.

In some embodiments, the step of forming a plurality of polysilicon layers respectively on the plurality of light-shielding elements, further includes:

forming a plurality of amorphous silicon layers on the base substrate formed with the plurality of light-shielding elements;

performing an annealing process on the plurality of amorphous silicon layers using an excimer laser annealing process, so that amorphous silicon in the plurality of amorphous silicon layers is converted into polysilicon; and performing a patterning process on the plurality of annealed amorphous silicon layers to obtain the plurality of polysilicon layers with different crystal forms.

In some embodiments, the step of performing a patterning process on the plurality of annealed amorphous silicon layers to obtain the plurality of polysilicon layers with different crystal forms, further includes:

performing a single patterning process on the plurality of annealed amorphous silicon layers to form a first polysilicon layer and a second polysilicon layer on the first light-shielding element and the second light-shielding element, respectively; or performing a first patterning process on the annealed amorphous silicon layers to form the first polysilicon layer on the first light-shielding element, and performing a second patterning process on the annealed amorphous silicon layers to form the second polysilicon layer on the second light-shielding element.

In some embodiments, the base substrate has a display region for provision of a display element and a peripheral region for provision of a drive circuit, the peripheral region being located at least at a side of the display region;

the peripheral region further includes: a gate drive circuit sub-region for provision of a gate drive circuit, and a source drive circuit sub-region for provision of a source drive circuit; and the gate drive circuit sub-region contains the first polysilicon layer therein, the source drive circuit sub-region contains the second polysilicon layer therein, and the display region contains the second polysilicon layer therein.

In some embodiments, the display region further includes: an infrared sensing sub-region for provision of an infrared sensor; and the third polysilicon layer is in the infrared sensing sub-region.

According to yet another aspect of the present disclosure, there is provided a display apparatus including: a display substrate assembly of any one of the abovementioned embodiments.

BRIEF DESCRIPTION OF THE DRAWINGS

In order to more clearly illustrate the technical solutions in the embodiments of the present disclosure, the drawings used in the description of the embodiments are briefly introduced below. Obviously, the drawings in the following description are only some embodiments of the present disclosure. For those of ordinary skill in the art, other drawings can be obtained based on these drawings without involving inventive labor.

DETAILED DESCRIPTION OF THE EMBODIMENTS

In order to make the objects, technical solutions, and advantages of the present disclosure more clear, the present disclosure will be further described in detail below with reference to the accompanying drawings. Obviously, the described embodiments are only some of the embodiments of the present disclosure, but not all the embodiments. Based on the embodiments described in the present disclosure, all other embodiments obtained by those skilled in the art without inventive labor shall fall within the protective scope of the present disclosure.

In the manufacturing process of an AMOLED display substrate assembly, the process of forming a polysilicon layer includes an Excimer Laser Annealing (ELA for short) process, a Solid Phase Crystallization (SPC for short) process, or a Metal Induces Crystallization (MIC for short) process. The ELA process to form a polysilicon layer is the only method that has achieved mass production. However, the polysilicon layer formed by the ELA process is difficult to meet the requirements of the gate drive circuit and the source drive circuit on the TFT.

At present, with the rapid development of smart phones and flexible display products, small and medium-sized display products have shown strong demand in the market, especially the high-performance full-screen partially transparent new display technology represented by AMOLED technology, is accelerating its entry into the high-end smart phone and wearable devices and other smart terminal markets with its unique performance advantages in display performance, lightness, thinness and flexibility. In the full-screen partially transparent new display technology, the display screen of the display product is a full screen. In order to meet the design requirements of a full screen, partial display region or all display region of the full screen are transparent display regions. In this way, external light will enter the transparent display regions and affect the display of the display screen. For example, smart phones have infrared sensors. The infrared sensor can be disposed on a non-display side of the display screen and the orthogonal projection area of the infrared sensor on the display screen can be set as the transparent display region. In this way, infrared light emitted by the infrared sensor can strike the front of the display screen through the transparent display region. However, when the infrared light emitted by the infrared sensor enters the transparent display region, it will cause the threshold voltage Vth of the TFT to drift, and the switching characteristics of the TFT will be affected, resulting in the problem of infrared light spots on the display screen.

Figure 1:
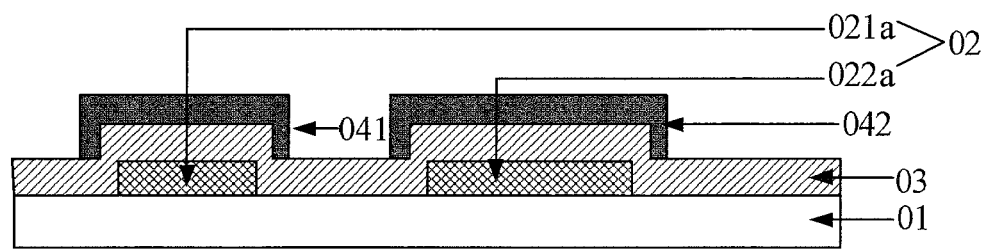
FIG. 1 is a schematic view showing a structure of a display substrate assembly according to an embodiment of the present disclosure.
Figure 2:
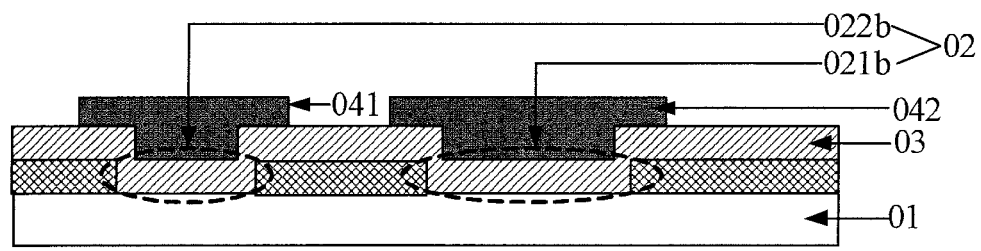
FIG. 2 is a schematic view showing a structure of a display substrate assembly according to another embodiment of the present disclosure.

Referring to FIG. 1 and FIG. 2, according to embodiments of the present disclosure, there is provided a display substrate assembly. The display substrate assembly includes: a base substrate 01; a light-shielding layer 02 on the base substrate 01, the light-shielding layer 02 having a plurality of light-shielding elements 021a, 022a (or 021b, 022b); and a plurality of polysilicon layers 041, 042 respectively on sides of the plurality of light-shielding elements away from the base substrate 01; wherein the plurality of light-shielding elements 021a, 022a (or 021b, 022b) have different sizes such that energy lights reflected and/or refracted through the plurality of light-shielding elements of different sizes respectively generate different thermal energy distributions on the plurality of polysilicon layers 041, 042 corresponding to the plurality of light-shielding elements, causing the plurality of polysilicon layers 04 to have different crystal forms.

In some embodiments, as shown in FIG. 1 and FIG. 2, the plurality of light-shielding elements 021a, 022a (or 021b, 022b) comprise a first light-shielding element 021a (or 021b) and a second light-shielding element 022a (or 022b), and the plurality of polysilicon layers 041, 042 comprise a first polysilicon layer 041 on the first light-shielding element 021a (or 021b) and a second polysilicon layer 042 on the second light-shielding element 022a (or 022b); and size of the first light-shielding element 021a (or 021b) is different from size of the second light-shielding element 022a (or 022b), and crystal form of the first polysilicon layer 041 is different from crystal form of the second polysilicon layer 042.

Specifically, the size of the first light-shielding element 021a (or 021b) is equal to or less than 5 microns, and the size of the second light-shielding element 022a (or 022b) is greater than 5 microns. Correspondingly, the crystal form of the first polysilicon layer 041 is hexagonal crystal form, and the crystal form of the second polysilicon layer 042 is tetragonal crystal form In some embodiments, the first light-shielding element 021a and the second light-shielding element 022a may be light-shielding blocks, as shown in FIG. 1. In some other embodiments, the first light-shielding element 021b and the second light-shielding element 022b may also be light-shielding holes, as shown in FIG. 2.

In some embodiments, as shown in FIG. 1 and FIG. 2, the display substrate assembly 01 further comprises a buffer layer 03. The buffer layer 03 is between the light-shielding layer 02 and the plurality of polysilicon layers 041, 042. Of course, in other embodiments, the buffer layer 03 may also be between the base substrate and the plurality of polysilicon layers.

In the display substrate assembly according to embodiments of the present disclosure, the base substrate has a display region for provision of a display element and a peripheral region for provision of a drive circuit, the peripheral region being located at least at a side of the display region. The peripheral region further comprises: a gate drive circuit sub-region for provision of a gate drive circuit, and a source drive circuit sub-region for provision of a source drive circuit. According to the design concept of the embodiments of the present disclosure, the light-shielding element corresponding to the polysilicon layer of the TFT for the gate drive circuit in the gate drive circuit sub-region adopts the first light-shielding element having its size equal to or less than 5 microns. The light-shielding elements corresponding to the polysilicon layer of the TFT for the display element in the display region and corresponding to the polysilicon layer of the TFT for the source drive circuit in the source drive circuit sub-region adopt the second light-shielding element having its size greater than 5 microns. In this way, the polysilicon layer of the TFT for the gate drive circuit in the gate drive circuit sub-region is the first polysilicon layer having hexagonal crystal form. The polysilicon layer of the TFT for the display element in the display region and the polysilicon layer of the TFT for the source drive circuit in the source drive circuit sub-region are the second polysilicon layer having tetragonal crystal form. That is to say, in the display substrate assembly according to embodiments of the present disclosure, the display region contains the second polysilicon layer therein, and the peripheral region contains the first polysilicon layer and the second polysilicon layer therein. More specifically, the gate drive circuit sub-region contains the first polysilicon layer therein, and the source drive circuit sub-region contains the second polysilicon layer therein.

Thus, in the display substrate assembly according to embodiments of the present disclosure, the light-shielding layer having the plurality of light-shielding elements are formed on the base substrate, and the corresponding polysilicon layer is formed on the side of each light-shielding element away from the base substrate. In the manufacturing process of the display substrate assembly, since these light-shielding elements have different sizes, energy lights reflected and/or refracted through the plurality of light-shielding elements of different sizes respectively generate different thermal energy distributions on the plurality of polysilicon layers corresponding to the plurality of light-shielding elements, causing the plurality of polysilicon layers to have different crystal forms. Accordingly, in the display substrate assembly according to embodiments of the present disclosure, the plurality of light-shielding elements having different sizes are provided between the base substrate and the polysilicon layers, so that the polysilicon layers formed by using the ELA process have different crystal forms, to meet different requirements of the polysilicon layers in different regions (for example, the display region, the gate drive circuit sub-region and the source drive circuit sub-region, etc.) of the display substrate assembly.

Figure 3:
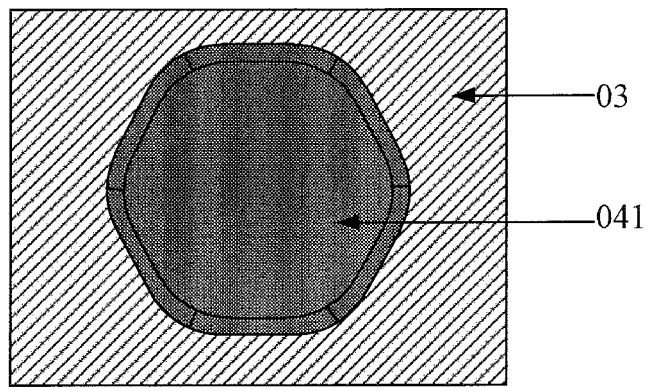
FIG. 3 is a schematic view showing a structure of a first polysilicon layer in the display substrate assembly according to the embodiment of the present disclosure.

Specifically, referring to FIG. 3, the crystal form of the first polysilicon layer 041 corresponding to the first light-shielding element on the buffer layer 03 is hexagonal crystal form. Grains of polycrystalline silicon of hexagonal crystal form are relatively larger in size, which can make the TFT have a high mobility greater than 200 $cm^2/V \cdot s$ (Square Centimeter/Volt·Second), which meets the switching requirements of a Complementary Metal Oxide Semiconductor (CMOS for short) TFT for the gate drive circuit. In the embodiments of the present disclosure, the size of the first light-shielding element is relatively small. When the amorphous silicon layer is annealed by the ELA process, the laser beam emitted by the XeCl excimer laser is irradiated onto the polysilicon above the first light-shielding element, and the laser beam is reflected on the surface of the polysilicon above the first light-shielding element, which changes the light field direction of the refracted light from the surface of the polysilicon above the first light-shielding element, thereby affecting the temperature distribution field of the laser beam on the polysilicon and eventually affecting the polysilicon above all the first light-shielding elements. The crystal form of the first polysilicon layer 041 corresponding to the first light-shielding element on the buffer layer 03 is hexagonal crystal form. When the size of the first light-shielding element is smaller, the crystal form of the first polysilicon layer 041 corresponding to the first light-shielding element on the buffer layer 03 is closer to a circle.

Figure 4:
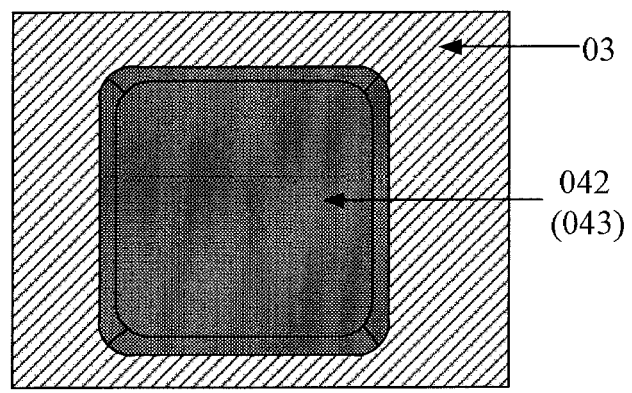
FIG. 4 is a schematic view showing a structure of a second polysilicon layer and a third polysilicon layer in the display substrate assembly according to the embodiment of the present disclosure.

Referring to FIG. 4, the crystal form of the second polysilicon layer 042 corresponding to the second light-shielding element on the buffer layer 03 is tetragonal crystal form. Grains of polycrystalline silicon of tetragonal crystal form are relatively smaller in size and are relatively uniform. The grains of the second polysilicon layer 042 corresponding to the second light-shielding element have the size between 300 nm and 400 nm and have better uniformity, which can make the TFT have better uniformity and make the TFT have lower leakage current, thereby meeting the requirements of the TFT for the source drive circuit.

Figure 15:
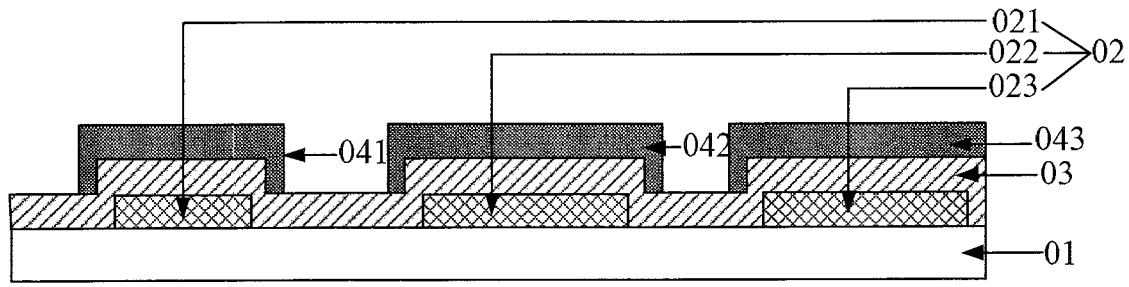
FIG. 15 is a schematic view showing a structure of a display substrate assembly according to yet another embodiment of the present disclosure.

Referring to FIG. 15, in a display substrate assembly according to yet another embodiment of the present disclosure, in addition to the first light-shielding element 021 and the second light-shielding element 022, the plurality of light-shielding elements of the light-shielding layer 02 further comprise a third light-shielding element 023. Correspondingly, in addition to the first polysilicon layer 041 on the first light-shielding element 021 and the second polysilicon layer 042 on the second light-shielding element 022, the plurality of polysilicon layers further comprise a third polysilicon layer 043 on the third light-shielding element 023. Size of the third light-shielding element 023 is different from the size of the first light-shielding element 021. Specifically, the size of the first light-shielding element 021 is equal to or less than 5 microns, and the size of the second light-shielding element 022 and the size of the third light-shielding element 023 are greater than 5 microns. Crystal form of the third polysilicon layer 043 is different from the crystal form of the first polysilicon layer 041. Specifically, the crystal form of the first polysilicon layer 041 is a hexagonal crystal form, and the crystal form of the second polysilicon layer 042 and the crystal form of the third polysilicon layer 043 are tetragonal crystal form. In addition, the first light-shielding element, the second light-shielding element, and third light-shielding element are light-shielding blocks. Of course, in other embodiments, the first light-shielding element and the second light-shielding element may also be light-shielding holes.

In the display substrate assembly according to embodiments of the present disclosure, the display region further comprises: an infrared sensing sub-region for provision of an infrared sensor. The light-shielding element corresponding to the polysilicon layer of the TFT in the infrared sensing sub-region is the third light-shielding element having its size greater than 5 microns. In this way, the polysilicon layer generated in the infrared sensing sub-region is the third polysilicon layer having tetragonal crystal form. That is to say, the third polysilicon layer is in the infrared sensing sub-region.

In the embodiments of the present disclosure, the third light-shielding element is provided under the third polysilicon layer of the TFT in the infrared sensing sub-region of the display substrate assembly to block external light, it is possible to prevent external light from entering the infrared sensing sub-region of the display substrate assembly, thereby avoiding the influence of external light on the display effect of the display substrate assembly. For example, the third light-shielding element is provided under the third polysilicon layer of the TFT in the infrared sensing sub-region. The third light-shielding element can block the infrared light emitted by the infrared sensor, to avoid the threshold voltage Vth of the TFT to drift, thereby avoiding the problem of infrared spots on the display substrate assembly.

It should be noted that, in the illustrated embodiment (for example, the embodiments shown in FIG. 1, FIG. 2 and FIG. 15), for the purpose of clarity, the display region (including the infrared sensing sub-region) and the peripheral regions (including the gate drive circuit sub-region and the source drive circuit sub-region) of the display substrate assembly are not clearly distinguished from each other, but are only shown schematically as the first, second and third light-shielding elements with different sizes and the corresponding first, second and third polysilicon layers with different crystal forms.

In addition, the display substrate according to the embodiments of the present disclosure further includes: a Gate Insulation (GI for short) layer; a gate, an Inter-Layer Dielectric (ILD for short), a source-drain layer, a planarization layer, a pixel electrode and a pixel defining layer, formed in sequence on the plurality of polysilicon layers, which will not be described in the present embodiment herein.

Embodiments of the present disclosure further provide a method of manufacturing a display substrate assembly, and the method comprises:

providing a base substrate;

forming a light-shielding layer on the base substrate, the light-shielding layer having a plurality of light-shielding elements; and forming a plurality of polysilicon layers respectively on sides of the plurality of light-shielding elements away from the base substrate;

wherein the plurality of light-shielding elements have different sizes such that energy lights reflected and/or refracted through the plurality of light-shielding elements of different sizes respectively generate different thermal energy distributions on the plurality of polysilicon layers corresponding to the plurality of light-shielding elements, causing the plurality of polysilicon layers to have different crystal forms.

In some embodiments, the plurality of light-shielding elements comprise a first light-shielding element and a second light-shielding element, and the plurality of polysilicon layers comprise a first polysilicon layer on the first light-shielding element and a second polysilicon layer on the second light-shielding element; and size of the first light-shielding element is different from size of the second light-shielding element, and crystal form of the first polysilicon layer is different from crystal form of the second polysilicon layer.

In some embodiments, the plurality of light-shielding elements further comprise a third light-shielding element, and the plurality of polysilicon layers further comprise a third polysilicon layer on the third light-shielding element; and size of the third light-shielding element is different from the size of the first light-shielding element, and crystal form of the third polysilicon layer is different from the crystal form of the first polysilicon layer.

In some embodiments, the size of the first light-shielding element is equal to or less than 5 microns, and the size of the second light-shielding element and the size of the third light-shielding element are greater than 5 microns.

In some embodiments, the crystal form of the first polysilicon layer is a hexagonal crystal form, and the crystal form of the second polysilicon layer and the crystal form of the third polysilicon layer are tetragonal crystal forms.

In some embodiments, the first light-shielding element and the second light-shielding element are light-shielding blocks or light-shielding holes, and the third light-shielding element is light-shielding block.

In some embodiments, the method further comprises: forming, prior to forming the plurality of polysilicon layers respectively on the plurality of light-shielding elements, a buffer layer on the base substrate formed with the light-shielding layer; or forming, prior to forming the light-shielding layer on the base substrate, the buffer layer on the base substrate.

In some embodiments, the step of forming a plurality of polysilicon layers respectively on the plurality of light-shielding elements, further comprises:

forming a plurality of amorphous silicon layers on the base substrate formed with the plurality of light-shielding elements;

performing an annealing process on the plurality of amorphous silicon layers using an excimer laser annealing process, so that amorphous silicon in the plurality of amorphous silicon layers is converted into polysilicon; and performing a patterning process on the plurality of annealed amorphous silicon layers to obtain the plurality of polysilicon layers with different crystal forms.

In some embodiments, the step of performing a patterning process on the plurality of annealed amorphous silicon layers to obtain the plurality of polysilicon layers with different crystal forms, further comprises:

performing a single patterning process on the plurality of annealed amorphous silicon layers to form the first polysilicon layer and the second polysilicon layer on the first light-shielding element and the second light-shielding element, respectively; or performing a first patterning process on the annealed amorphous silicon layers to form the first polysilicon layer on the first light-shielding element, and performing a second patterning process on the annealed amorphous silicon layers to form the second polysilicon layer on the second light-shielding element.

In some embodiments, the base substrate has a display region for provision of a display element and a peripheral region for provision of a drive circuit, the peripheral region being located at least at a side of the display region; the peripheral region further comprises: a gate drive circuit sub-region for provision of a gate drive circuit, and a source drive circuit sub-region for provision of a source drive circuit; and the gate drive circuit sub-region contains the first polysilicon layer therein, the source drive circuit sub-region contains the second polysilicon layer therein, and the display region contains the second polysilicon layer therein.

In some embodiments, the display region further comprises: an infrared sensing sub-region for provision of an infrared sensor; and the third polysilicon layer is in the infrared sensing sub-region.

Figure 5:
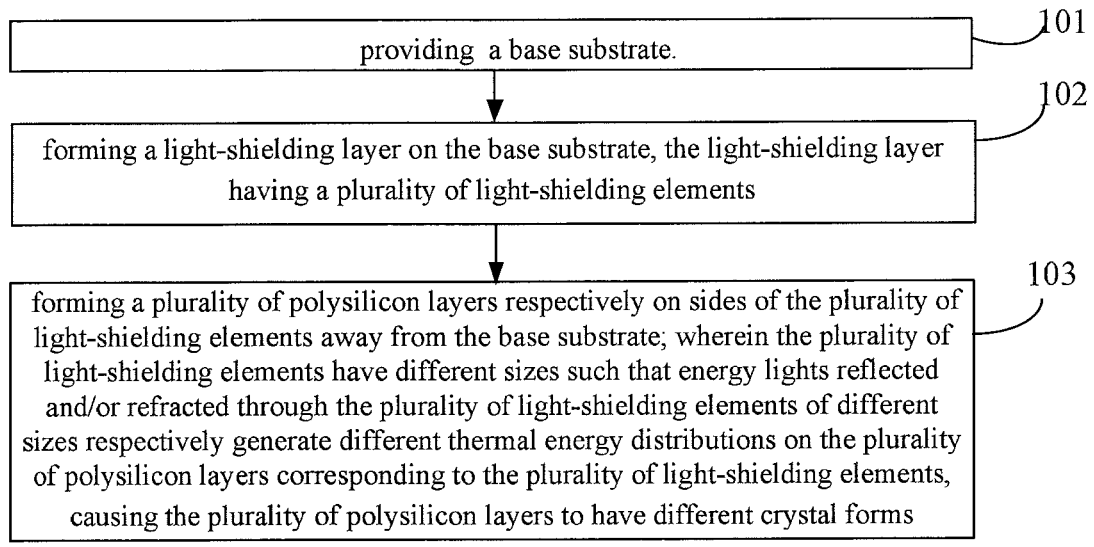
FIG. 5 is a method flowchart showing a method of manufacturing a display substrate assembly according to an embodiment of the present disclosure.

Referring to FIG. 5, it is a method flowchart showing a method of manufacturing a display substrate assembly according to an embodiment of the present disclosure. As shown in FIG. 5, the method comprises the following steps 101-103.

The step 101 is to provide a base substrate.

The step 102 is to form a light-shielding layer on the base substrate, the light-shielding layer having a plurality of light-shielding elements.

The step 103 is to form a plurality of polysilicon layers respectively on sides of the plurality of light-shielding elements away from the base substrate; wherein the plurality of light-shielding elements have different sizes such that energy lights reflected and/or refracted through the plurality of light-shielding elements of different sizes respectively generate different thermal energy distributions on the plurality of polysilicon layers corresponding to the plurality of light-shielding elements, causing the plurality of polysilicon layers to have different crystal forms.

Figure 6:
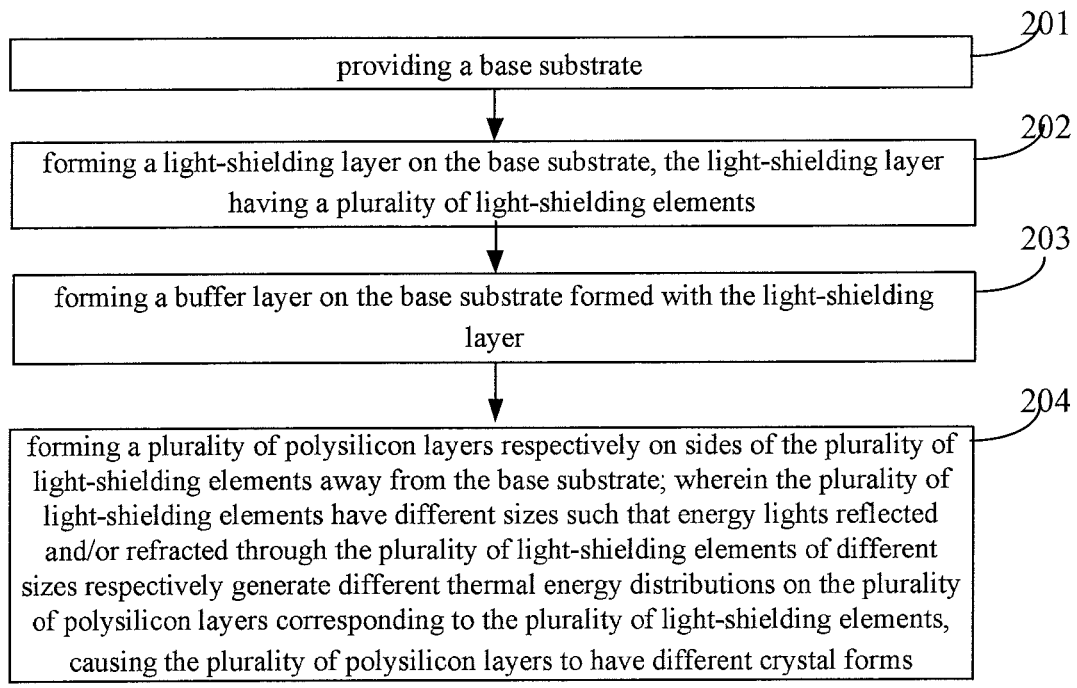
FIG. 6 is a method flowchart showing a method of manufacturing a display substrate assembly according to another embodiment of the present disclosure.

Referring to FIG. 6, it is a method flowchart showing a method of manufacturing a display substrate assembly according to another embodiment of the present disclosure. As shown in FIG. 6, the method comprises the following steps 201-204.

The step 201 is to provide a base substrate.

The step 202 is to form a light-shielding layer on the base substrate, the light-shielding layer having a plurality of light-shielding elements.

The step 203 is to form a buffer layer on the base substrate formed with the light-shielding layer.

The step 204 is to form a plurality of polysilicon layers respectively on sides of the plurality of light-shielding elements away from the base substrate; wherein the plurality of light-shielding elements have different sizes such that energy lights reflected and/or refracted through the plurality of light-shielding elements of different sizes respectively generate different thermal energy distributions on the plurality of polysilicon layers corresponding to the plurality of light-shielding elements, causing the plurality of polysilicon layers to have different crystal forms.

By comparing FIG. 5 with FIG. 6, it can be known that the manufacturing method flowchart shown in FIG. 6 has one more step of forming a buffer layer than the manufacturing method flowchart shown in FIG. 5. It should be noted that, according to the design concept of the present disclosure, the basic steps of the manufacturing method may not include the step of forming a buffer layer. However, in order to explain the manufacturing method according to the present disclosure clearly and in detail, the manufacturing method flowchart shown in FIG. 6 is used in the following to describe and explain the method of manufacturing a display substrate assembly according to embodiments of the present disclosure in detail.

Referring to FIG. 2, the step 201 is to provide a base substrate. Specifically, the base substrate may be a transparent substrate, which may be a substrate made of light guiding and non-metallic materials with certain robustness, such as glass, quartz, or transparent resin, or the base substrate may be a flexible transparent substrate made of polyimide (PI for short).

The step 202 is to form a light-shielding layer on the base substrate, the light-shielding layer having a plurality of light-shielding elements.

Specifically, the plurality of light-shielding elements comprise a first light-shielding element and a second light-shielding element, and size of the first light-shielding element is different from size of the second light-shielding element. In the present embodiment, the light-shielding layer comprises a plurality of first light-shielding elements and a plurality of second light-shielding elements. Each first light-shielding element is for forming the polysilicon layer of one TFT in the gate drive circuit, and each second light-shielding element is for forming the polysilicon layer of one TFT in the source drive circuit. The size of the first light-shielding element may be equal to or less than 5 μm (microns), and the size of the second light-shielding element may be greater than 5 μm (microns). For example, the size of the first light-shielding element is 3 μm, 4 μm or 5 μm, and the size of the second light-shielding element is 8 μm, 10 μm, 15 μm, 20 μm or 40 μm. In the embodiments of the present disclosure, the size of the first light-shielding element can be determined according to the channel length of the TFT in the gate drive circuit, and the size of the second light-shielding element can be determined according to the channel length of the TFT in the source drive circuit.

In some embodiments, the base substrate may be cleaned firstly, and then a Light Shield (LS for short) layer is formed on the base substrate. In the present embodiment, forming a light-shielding layer on a base substrate may include the following two implementations.

In a first implementation, a light-shielding layer is formed on the base substrate. The light-shielding layer includes a first convex structure and a second convex structure. The first light-shielding element is the area where the first convex structure is located, and the second light-shielding element is the area where the second convex structure is located.

Figure 7:
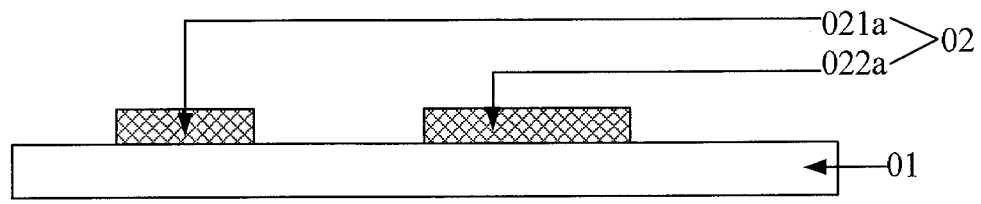
FIG. 7 is a schematic view showing a structure subsequent to forming a light-shielding layer on a base substrate, according to an embodiment of the present disclosure.

Referring to FIG. 7, it is a schematic view showing a structure subsequent to forming a light-shielding layer 02 on a base substrate 01, according to an embodiment of the present disclosure. The light-shielding layer 02 includes a plurality of first convex structures 021a (only one is shown in FIG. 7) and a plurality of second convex structures 022a (only one is shown in FIG. 7). Both the first convex structure 021a and the second convex structure 022a are light-shielding blocks, the light-shielding layer 02 has a plurality of first light-shielding elements and a plurality of second light-shielding elements, each first light-shielding element is an area where one first convex structure 021a is located, and each second light-shielding element is an area where one second convex structure 022a is located. In this first implementation, the size of the first light-shielding element is also the size of the first convex structure 021a, and the size of the second light-shielding element is also the size of the second convex structure 022a. The size of the first light-shielding element is different from that of the second light-shielding element, so the size of the first convex structure 021a is different from that of the second convex structure 022a. In some embodiments, the first convex structure 021a and the second convex structure 022a are both light-shielding blocks. Accordingly, the size of the first convex structure 021a and the size of the second convex structure 022a are also the size of the light-shielding block. When the cross-section of the shielding block is square, the size of the light-shielding block is the side length of the cross-section of the light-shielding block, and the cross-section of the light-shielding block is the plane of the light-shielding block parallel to the surface of the base substrate 01.

In the embodiments of the present disclosure, the light-shielding layer 02 may be formed by using metal Mo (molybdenum), and the thickness of the light-shielding layer 02 may range from 50 nm (nanometer) to 250 nm (nanometer). For example, a layer of metal Mo with a thickness of 50 nm to 250 nm can be sputtered on the base substrate 01 by using a magnetron sputtering process to obtain a metal Mo material layer, and then the metal Mo material layer is processed through a single patterning process to obtain the light-shielding layer 02. The single patterning process includes: photoresist coating, exposure, development, etching and photoresist stripping. Accordingly, processing the metal Mo material layer through the single patterning process to obtain the light-shielding layer 02 may include: coating a layer of photoresist onto the metal Mo material layer to obtain a photoresist layer, exposing the photoresist layer by using a mask so that the photoresist layer is formed into a fully exposed area and a non-exposed area, and then performing a developing process so that the photoresist in the fully exposed area is completely removed and the photoresist in the non-exposed area is completely retained, etching an area corresponding to the fully exposed area on the metal Mo material layer by an etching process, and then stripping off the photoresist in the non-exposed area so that the first convex structure 021a and the second convex structure 022a are formed in the areas corresponding to the non-exposed areas on the metal Mo material layer, thereby obtaining the light-shielding layer 02.

It should be noted that, because the size of the first convex structure 021a and the size of the second convex structure 022a are different, when a photoresist layer is exposed using a mask, a mask having two different mask patterns may be used. The photoresist layer is exposed to form the first convex structure 021a and the second convex structure 022a. In addition, the metal Mo material layer can also be processed through two patterning processes to obtain the first convex structure 021a and the second convex structure 022a. It should also be noted that the embodiments of the present disclosure are described by using a positive photoresist to form the light-shielding layer 02 as an example. Of course, a negative photoresist can also be used to form the light-shielding layer 02, which will not be described in the embodiments of the present disclosure herein.

In a second implementation, a light-shielding layer is formed on the base substrate. The light-shielding layer includes a first recessed structure and a second recessed structure. The first light-shielding element is the area where the first recessed structure is located, and the second light-shielding element is the area where the second recessed structure is located.

Figure 8:
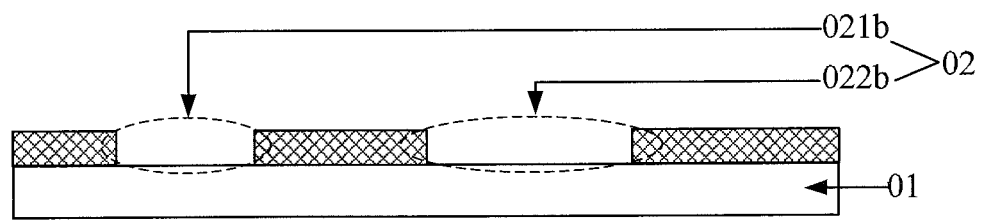
FIG. 8 is a schematic view showing a structure subsequent to forming a light-shielding layer on a base substrate, according to another embodiment of the present disclosure.
Figure 9:
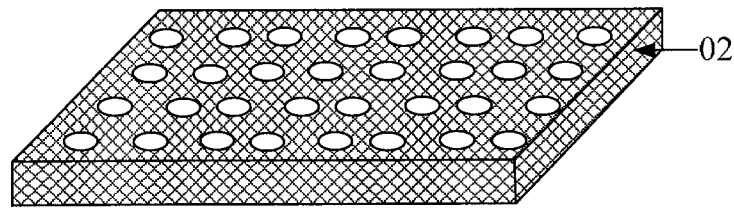
FIG. 9 is a schematic view showing a structure of a light-shielding layer according to an embodiment of the present disclosure.

FIG. 8 is a schematic view showing a structure subsequent to forming a light-shielding layer 02 on a base substrate 01, according to another embodiment of the present disclosure. The light-shielding layer 02 includes a plurality of first recessed structures 021b (only one is shown in FIG. 8) and a plurality of second recessed structures 022b (only one is shown in FIG. 8). Both the first recessed structure 021b and the second recessed structure 022b are hole structure, the light-shielding layer 02 has a plurality of first light-shielding elements and a plurality of second light-shielding elements, each first light-shielding element is an area where one first recessed structure 021b is located, and each second light-shielding element is an area where one second recessed structure 022b is located. In this second implementation, the size of the first light-shielding element is also the size of the first recessed structure 021b, and the size of the second light-shielding element is also the size of the second recessed structure 022b. The size of the first light-shielding element is different from that of the second light-shielding element, so the size of the first recessed structure 021b is different from that of the second recessed structure 022b. In some embodiments, the first recessed structure 021b and the second recessed structure 022b are both hole structures. Therefore, the size of the first recessed structure 021b and the size of the second recessed structure 022b are also the size of the hole structure. The hole structure may be a rectangular hole or a round hole. When the hole structure is a rectangular hole, the size of the hole structure is a side length of an opening surface of the hole structure. When the hole structure is a round hole, the size of the hole structure is a diameter of the opening surface of the hole structure. As shown in FIG. 9, it illustrates a schematic diagram of the light-shielding layer 02 according to an embodiment of the present disclosure. In the light-shielding layer 02 shown in FIG. 9, the hole structure is a round hole.

It should be noted that the process of forming the light-shielding layer 02 in this second implementation is the same as or similar to that in the first implementation described above, except that, after the area corresponding to the fully exposed area on the metal Mo material layer is etched by an etching process, the area corresponding to the fully exposed area on the metal Mo material layer forms the first recessed structure 021b and the second recessed structure 022b, which will not be described in the embodiments of the present disclosure herein.

The step 203 is to form a buffer layer on the base substrate formed with the light-shielding layer.

Figure 10:
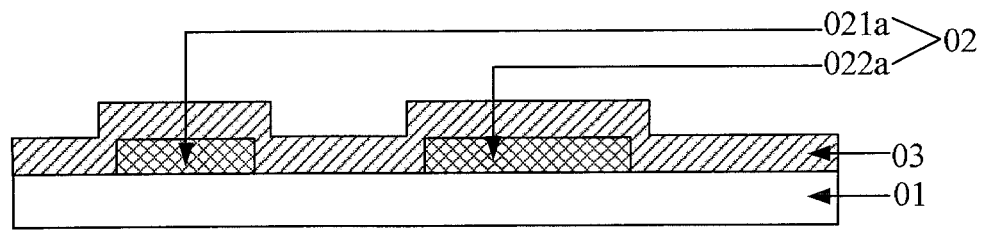
FIG. 10 is a schematic view showing a structure subsequent to forming a buffer layer on the base substrate formed with the light-shielding layer, according to an embodiment of the present disclosure.
Figure 11:
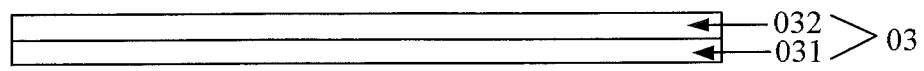
FIG. 11 is a schematic view showing a double-layered structure of a buffer layer according to an embodiment of the present disclosure.
Figure 12:
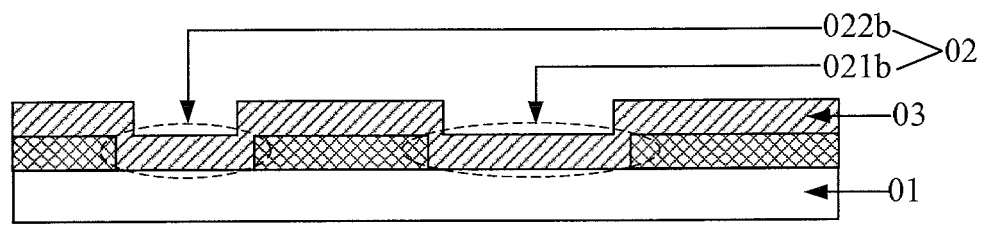
FIG. 12 is a schematic view showing a structure subsequent to forming a buffer layer on the base substrate formed with the light-shielding layer, according to another embodiment of the present disclosure.

FIG. 10 and FIG. 12 are schematic views showing structures subsequent to forming a buffer layer 03 on the base substrate 01 formed with the light-shielding layer 02, according to embodiments of the present disclosure, here, the light-shielding layer 02 of FIG. 10 includes light-shielding blocks and the light-shielding layer 02 of FIG. 12 includes hole structures. In some embodiments, as shown in FIG. 11, the buffer layer 03 has a double-layered structure, and includes a silicon nitride (SiNx) layer 031 and a silicon dioxide (SiO$_2$) layer 032 disposed in that order. Accordingly, to form a buffer layer 03 on the base substrate 01 formed with the light-shielding layer 02 may include: forming a silicon nitride layer 031 on the base substrate 01 formed with the light-shielding layer 02; and forming a silicon dioxide layer 032 on the base substrate 01 formed with the silicon nitride layer 031. The thickness of the silicon nitride layer can range from about 50 nm to 150 nm, and the thickness of the silicon dioxide layer can range from about 100 nm to 350 nm.

In some embodiments, a Plasma Enhanced Chemical Vapor Deposition (PECVD for short) process may be first used to deposit a layer of silicon nitrogen having a thickness of 50 nm-150 nm on the base substrate 01 formed with the light-shielding layer 02, to form a silicon nitride layer, and then a PECVD process is adopted to deposit a layer of silicon dioxide having a thickness of 100-350 nm on the base substrate 01 formed with the silicon nitride layer to form a silicon dioxide layer, thereby forming a buffer layer 03 on the base substrate 01 formed with the light-shielding layer 02.

The step 204 is to form a plurality of polysilicon layers respectively on sides of the plurality of light-shielding elements away from the base substrate; wherein the plurality of light-shielding elements have different sizes such that energy lights reflected and/or refracted through the plurality of light-shielding elements of different sizes respectively generate different thermal energy distributions on the plurality of polysilicon layers corresponding to the plurality of light-shielding elements, causing the plurality of polysilicon layers to have different crystal forms.

Figure 13:
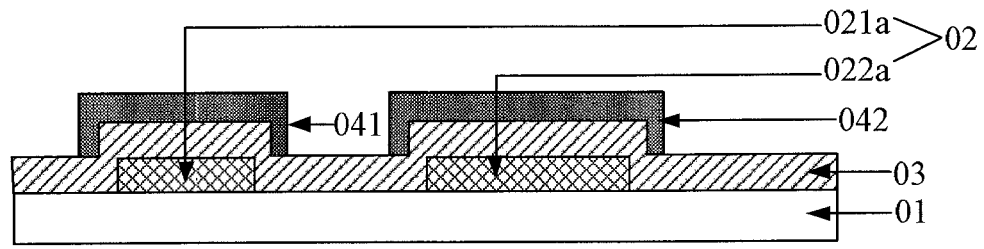
FIG. 13 is a schematic view showing a structure subsequent to forming a first polysilicon layer and second polysilicon layer respectively on a first light-shielding element and a second light-shielding element after forming the buffer layer, according to an embodiment of the present disclosure.
Figure 14:
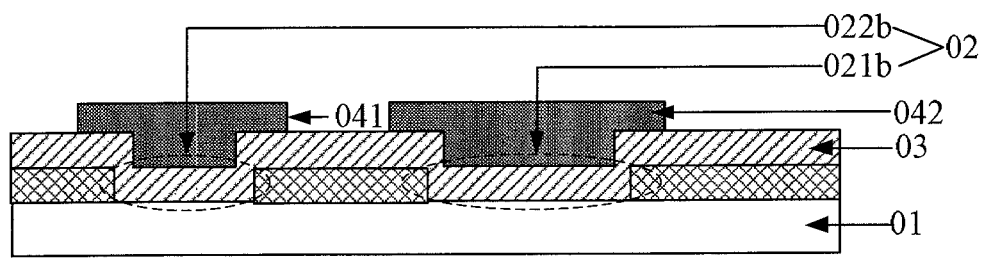
FIG. 14 is a schematic view showing a structure subsequent to forming a first polysilicon layer and second polysilicon layer respectively on a first light-shielding element and a second light-shielding element after forming the buffer layer, according to another embodiment of the present disclosure.

Specifically, FIG. 13 and FIG. 14 are respectively schematic views showing structures subsequent to forming a first polysilicon (p-si) layer 041 and a second polysilicon (p-si) layer 042 respectively on sides of a first light-shielding element 021a, 021b and a second light-shielding element 022a, 022b away from the base substrate 01, according to embodiments of the present disclosure. In FIG. 13 the first and second light-shielding elements of the light-shielding layer 02 are specifically light-shielding blocks (taking the first convex structure 021a and the second convex structure 022a as examples). In FIG. 14 the first and second light-shielding elements of the light-shielding layer 02 are specifically hole structures (taking the first recessed structure 021b and the second recessed structure 022b as examples), the thickness of the first and second polysilicon layers 041 and 042 can range from 30 nm to 60 nm.

In embodiments of the present disclosure, the step of forming the first polysilicon layer 041 and the second polysilicon layer 042 respectively on sides of the first light-shielding elements 021a, 021b and the second light-shielding elements 022a, 022b away from the base substrate 01 may include: forming an amorphous silicon (a-si) layer on the base substrate 01 formed with the buffer layer 03; annealing the amorphous silicon layer by the ELA process to convert amorphous silicon into polysilicon; performing a single patterning process on the annealed amorphous silicon layer to form the first polysilicon layer 041 and the second polysilicon layer 042 on sides of the first light-shielding elements 021a, 021b and the second light-shielding elements 022a, 022b away from the base substrate 01, respectively. In some embodiments, a PECVD process may be used to deposit a layer of amorphous silicon having a thickness of 30 nm to 60 nm on the base substrate 01 formed with the buffer layer 03, and then the amorphous silicon is heated at a temperature of 400° C. to 450° C. (Celsius) for 0.5~3 hours to obtain the amorphous silicon layer; and then an anneal process is performed on the amorphous silicon layer by the ELA process using an XeCl excimer laser to obtain the annealed amorphous silicon layer, after that, a single patterning process is performed on the annealed amorphous silicon layer to form the first polysilicon layer 041 and the second polysilicon layer 042 respectively on sides of the first light-shielding elements 021a, 021b and the second light-shielding elements 022a, 022b away from the base substrate 01. Laser wavelength of the XeCl excimer laser is 308 nm, parameters of the ELA process include: laser pulse frequency is 300 Hz (Hertz), overlap rate is 92%~98%, laser scanning rate is 9.6~2.4 mm/s (millimeter per second), laser energy density is 300 mJ/cm$^2$~500 mJ/cm$^2$ (megajoules per square centimeter). The process of processing the annealed amorphous silicon layer through a single patterning process can refer to the process of processing the metal Mo material layer through the single patterning process in step 201 described above, which is not described in this embodiment.

It should be noted that, because the size of the first light-shielding element is different from that of the second light-shielding element, the size of the first polysilicon layer located on the first light-shielding element is different from that of the second polysilicon layer located on the second light-shielding element. When the annealed amorphous silicon layer is processed by the single patterning process, the photoresist layer can be exposed by using a mask with two different mask patterns. Of course, the annealed amorphous silicon layer can also be processed by two patterning processes, which will not be described in this embodiment.

It should be noted that after the first and second polysilicon layers are formed, channel doping (Vth Doping) can be performed on the first and second polysilicon layers, and then HF (hydrogen fluoride) is used to clean the base substrate formed with the first and second polysilicon layers, after that, a Gate Insulation (GI for short) layer, a gate, an Inter-Layer Dielectric (ILD for short), a source-drain layer, a planarization layer, a pixel electrode and a pixel defining layer, etc. are formed in sequence on the base substrate formed with the first and second polysilicon layers. After the GI layer is formed, a source-drain doping can be performed on the GI layer. After the ILD is formed, via holes can be formed in the ILD and the GI layer, so that the source and the drain of the source-drain layer can be in contact with the first and second polysilicon layers, respectively, through the via holes in the ILD and the via holes in the GI layer, and thus the display substrate assembly is obtained.

Thus, with the method of manufacturing a display substrate assembly according to embodiments of the present disclosure, the light-shielding layer having the plurality of light-shielding elements are formed on the base substrate, and the corresponding polysilicon layer is formed on the side of each light-shielding element away from the base substrate. In the manufacturing process of the display substrate assembly, since these light-shielding elements have different sizes, energy lights reflected and/or refracted through the plurality of light-shielding elements of different sizes respectively generate different thermal energy distributions on the plurality of polysilicon layers corresponding to the plurality of light-shielding elements, causing the plurality of polysilicon layers to have different crystal forms. Accordingly, with the method of manufacturing a display substrate assembly according to embodiments of the present disclosure, the plurality of light-shielding elements having different sizes are provided between the base substrate and the polysilicon layers, so that the polysilicon layers formed by using the ELA process have different crystal forms, to meet different requirements of the polysilicon layers in different regions (for example, the display region, the gate drive circuit sub-region and the source drive circuit sub-region, etc.) of the display substrate assembly.

Figure 16:
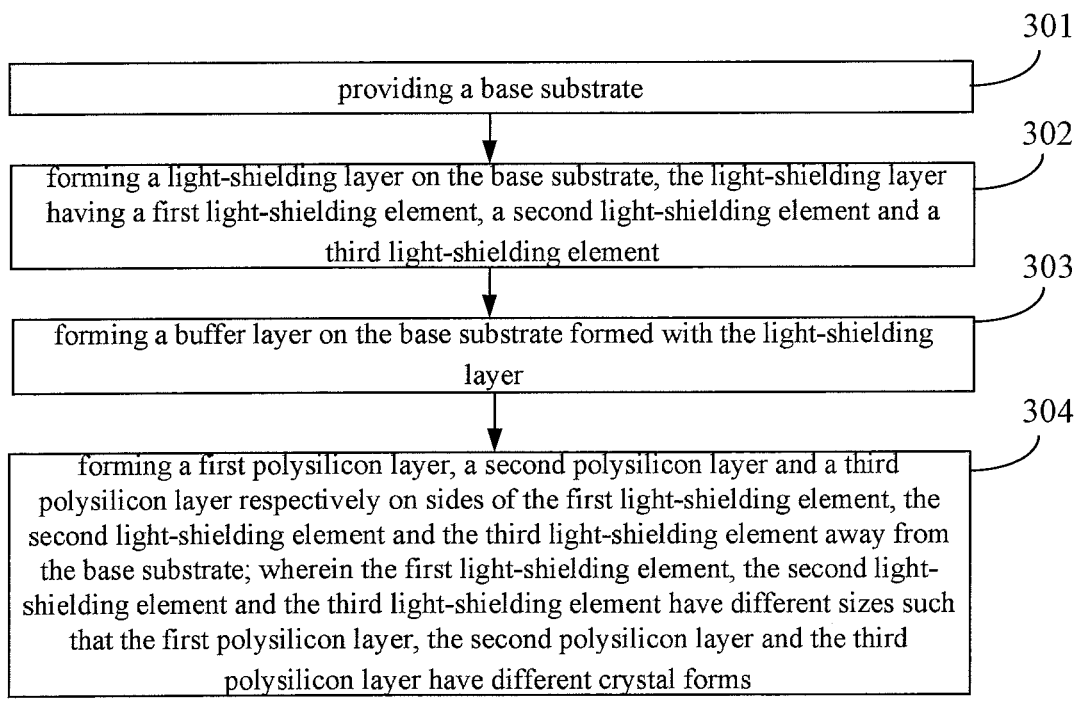
FIG. 16 is a method flowchart showing a method of manufacturing a display substrate assembly according to yet another embodiment of the present disclosure.

Referring to FIG. 16, it is a method flowchart showing a method of manufacturing a display substrate assembly according to yet another embodiment of the present disclosure. As shown in FIG. 16, the method comprises at least the following steps 301-304.

The step 301 is to provide a base substrate. For the related content of this step, please refer to the related description and explanation of step S201 in the embodiment shown in FIG. 2, which is not repeated in this embodiment.

The step 302 is to form a light-shielding layer on the base substrate, the light-shielding layer having a first light-shielding element, a second light-shielding element and a third light-shielding element. Here, the first light-shielding element is used to form the first polysilicon layer of the TFT in the gate drive circuit, the second light-shielding element is used to form the second polysilicon layer of the TFT in the source drive circuit, and the third light-shielding element is used to form the third polysilicon layer of the TFT in the transparent display region. The size of the first light-shielding element is different from the size of the second light-shielding element, and the size of the third light-shielding element is different from the size of the first light-shielding element.

In the present embodiment, the light-shielding layer has a plurality of first light-shielding elements, a plurality of second light-shielding elements and a plurality of third light-shielding elements. For the description of the first light-shielding elements and the second light-shielding elements, it can refer to step 202 in the embodiment shown in FIG. 2. Each third light-shielding element is used to form a polysilicon layer of a TFT in the infrared sensing sub-region. The size of the third light-shielding element may be greater than 5 μm, and the size of the third light-shielding element may be the same as or different from the size of the second light-shielding element. For example, the size of the third light-shielding element is 8 μm, 10 μm, 15 μm, 20 μm or 40 μm. The size of the third light-shielding element can be determined according to the channel length of the TFT in the infrared sensing sub-region.

In the present embodiment, to form a light-shielding layer on the base substrate may include: forming a light-shielding layer on the base substrate, the light-shielding layer including a first convex structure, a second convex structure and a third convex structure. The first light-shielding element is the area where the first convex structure is located, the second light-shielding element is the area where the second convex structure is located, and the third light-shielding element is the area where the third convex structure is located.

Figure 17:
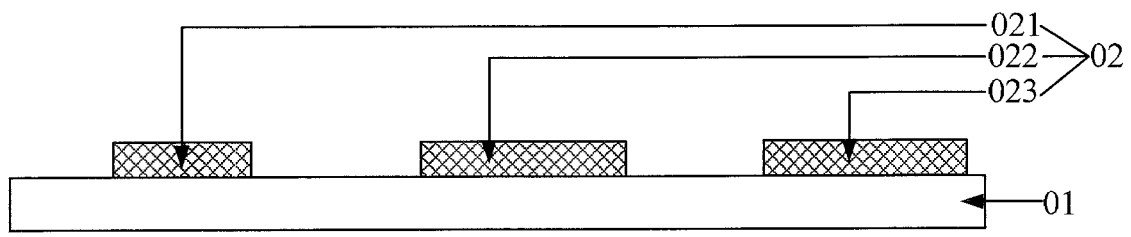
FIG. 17 is a schematic view showing a structure subsequent to forming a light-shielding layer on a base substrate, according to yet another embodiment of the present disclosure.

Referring to FIG. 17, it is a schematic view showing a structure subsequent to forming a light-shielding layer 02 on a base substrate 01, according to yet another embodiment of the present disclosure. As shown in FIG. 17, the light-shielding layer 02 includes a plurality of first convex structures 021 (only one is shown in FIG. 17), a plurality of second convex structures 022 (only one is shown in FIG. 17) and a plurality of third convex structures 023 (only one is shown in FIG. 17). All the first convex structure 021, the second convex structure 022 and the third convex structure 023 are light-shielding blocks, the light-shielding layer 02 has a plurality of first light-shielding elements. a plurality of second light-shielding elements and a plurality of third light-shielding elements, each first light-shielding element is an area where one first convex structure 021 is located, each second light-shielding element is an area where one second convex structure 022 is located, and each third light-shielding element is an area where one third convex structure 023 is located. The size of the first light-shielding element is also the size of the first convex structure 021, the size of the second light-shielding element is also the size of the second convex structure 022, and the size of the third light-shielding element is also the size of the third convex structure 023. The size of the first light-shielding element is different from that of the second light-shielding element and the size of the third light-shielding element is different from that of the first light-shielding element, so the size of the first convex structure 021 is different from that of the second convex structure 022 and the size of the first convex structure 021 is different from that of the third convex structure 023. In some embodiments, the first convex structure 021, the second convex structure 022 and the third convex structure 023 are light-shielding blocks, the size of the first convex structure 021, the size of the second convex structure 022 and the size of the third convex structure 023 are the size of the light-shielding block. For the formation process of the light-shielding layer 02, refer to the first implementation of the embodiment shown in FIG. 2, which is not repeated in this embodiment.

The step 303 is to form a buffer layer on the base substrate formed with the light-shielding layer.

Figure 18:
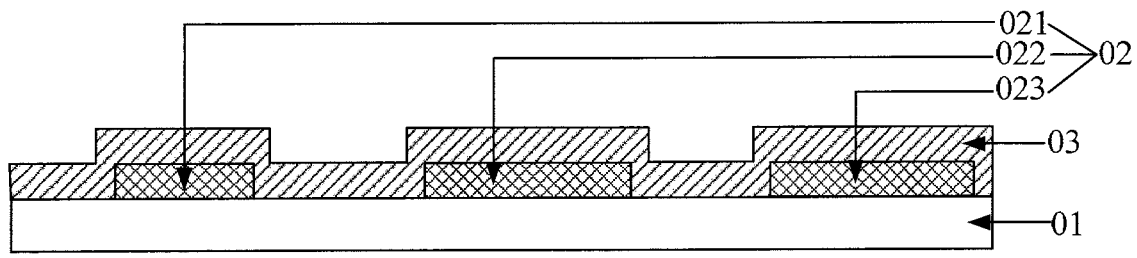
FIG. 18 is a schematic view showing a structure subsequent to forming a buffer layer on the base substrate formed with the light-shielding layer, according to yet another embodiment of the present disclosure.

Referring to FIG. 18, it is a schematic view showing a structure subsequent to forming a buffer layer 03 on the base substrate 01 formed with the light-shielding layer 02, according to yet another embodiment of the present disclosure. For the structure and formation process of the buffer layer 03, please refer to the embodiment shown in FIG. 2, which is not repeated in this embodiment.

The step 304 is to form a first polysilicon layer, a second polysilicon layer and a third polysilicon layer respectively on sides of the first light-shielding element, the second light-shielding element and the third light-shielding element away from the base substrate; wherein the first light-shielding element, the second light-shielding element and the third light-shielding element have different sizes such that the first polysilicon layer, the second polysilicon layer and the third polysilicon layer have different crystal forms.

Figure 19:
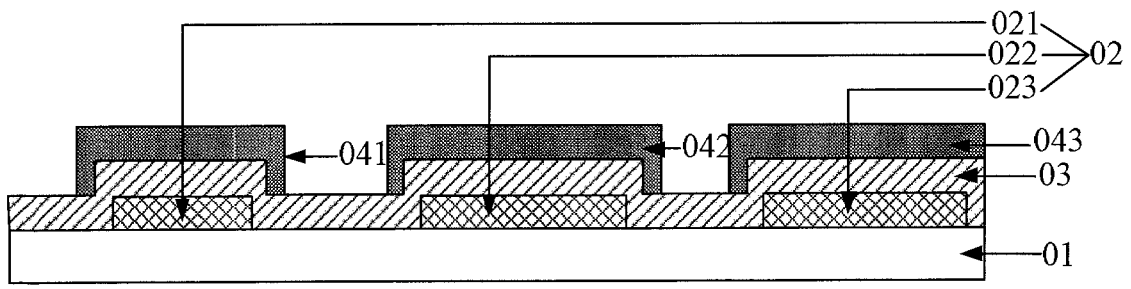
FIG. 19 is a schematic view showing a structure subsequent to forming a first polysilicon layer, a second polysilicon layer and a third polysilicon layer respectively on a first light-shielding element, a second light-shielding element and a third light-shielding element after forming the buffer layer, according to an embodiment of the present disclosure.

Referring to FIG. 19, it is a schematic view showing a structure subsequent to forming a first polysilicon layer 041, a second polysilicon layer 042 and a third polysilicon layer 043 respectively on the buffer layer 03 corresponding to a first light-shielding element 021, a second light-shielding element 022 and a third light-shielding element 023, according to an embodiment of the present disclosure.

The crystal form of the first polysilicon layer 041 corresponding to the first light-shielding element 021 on the buffer layer 03 is hexagonal crystal form, the crystal form of the second polysilicon layer 042 corresponding to the second light-shielding element 022 on the buffer layer 03 and the crystal form of the third polysilicon layer 043 corresponding to the third light-shielding element 023 on the buffer layer 03 are tetragonal crystal form. Grains of polycrystalline silicon of hexagonal crystal form are relatively larger in size, which can make the TFT have a high mobility greater than 200 cm$^2$/V·s, which meets the switching requirements of a CMOS TFT for the gate drive circuit. Grains of polycrystalline silicon of tetragonal crystal form are relatively smaller in size and are relatively uniform. The grains of the polysilicon layer on the second light-shielding element have the size between 300 nm and 400 nm and have better uniformity, which can make the TFT have better uniformity and make the TFT have lower leakage current, thereby meeting the requirements of the TFT for the source drive circuit, ensuring that the electrical performance of the TFT channel of the infrared sensing sub-region is consistent with the electrical performance of the TFT channel of the source drive circuit sub-region.

It should be noted that, in the same way as the embodiment shown in FIG. 2, after forming these polysilicon layers, channel doping can be performed on the polysilicon layers, and then HF is used to clean the base substrate 01 formed with the polysilicon layers. After that, a GI layer, a gate, an ILD, a source-drain layer, a planarization layer, a pixel electrode and a pixel defining layer are sequentially formed on the base substrate 01 formed with the polysilicon layers, to obtain a display substrate assembly.

In the embodiments of the present disclosure, the light-shielding element is provided under the polysilicon layer of the TFT in the infrared sensing sub-region of the display region of the display substrate assembly to block external light, it is possible to prevent external light from entering the infrared sensing sub-region of the display substrate assembly, thereby avoiding the influence of external light on the display effect of the display substrate assembly. For example, the third light-shielding element is provided under the third polysilicon layer of the TFT in the infrared sensing sub-region. The third light-shielding element can block the infrared light emitted by the infrared sensor, to avoid the threshold voltage Vth of the TFT to drift, thereby avoiding the problem of infrared spots on the display substrate assembly.

Thus, with the method of manufacturing a display substrate assembly according to embodiments of the present disclosure, the light-shielding layer having the plurality of light-shielding elements are formed on the base substrate, and the corresponding polysilicon layer is formed on the side of each light-shielding element away from the base substrate. In the manufacturing process of the display substrate assembly, since these light-shielding elements have different sizes, energy lights reflected and/or refracted through the plurality of light-shielding elements of different sizes respectively generate different thermal energy distributions on the plurality of polysilicon layers corresponding to the plurality of light-shielding elements, causing the plurality of polysilicon layers to have different crystal forms. Accordingly, with the method of manufacturing a display substrate assembly according to embodiments of the present disclosure, the plurality of light-shielding elements having different sizes are provided between the base substrate and the polysilicon layers, so that the polysilicon layers formed by using the ELA process have different crystal forms, to meet different requirements of the polysilicon layers in different regions (for example, the display region, the gate drive circuit sub-region and the source drive circuit sub-region, etc.) of the display substrate assembly. Further, the light-shielding layer also has a third light-shielding element. The light-shielding blocks of the third light-shielding element can block external light so as to avoid the influence of infrared light on the TFT of the infrared sensing sub-region of the display substrate assembly, thereby avoiding the problem of infrared spots. The method according to the embodiments of the present disclosure is applicable to the field of low temperature poly-silicon active matrix organic light emitting diode display (LTPS-AMOLED for short).

According to embodiments of the present disclosure, there is further provided a display apparatus including the display substrate assembly according to the foregoing embodiments. The display apparatus may be a mobile terminal such as a mobile phone or a tablet computer, or else, the display apparatus may be any product or component having a display function such as a television, a display, a notebook computer, a digital photo frame, or a navigator.

Those skilled in the art may understand that all or some of the steps for implementing the foregoing embodiments may be executed by hardware, or may be executed by a program that can be stored in a computer-readable storage medium to instruct related hardware. The mentioned storage medium includes, but is not limited to, any type of disk (including a floppy disk, a hard disk, a compact disk, and a CD-ROM, and a magneto-optical disk), ROM (Read-Only Memory), RAM (Random Access Memory), EPROM (Erasable Programmable Read-Only Memory), EEPROM (Electrically Erasable Programmable Read-Only Memory), flash memory, magnetic card or optical card.

The above are merely exemplary embodiments of the present disclosure and are not intended to limit the present disclosure. Any modifications, equivalent replacements, changes, etc. made within the spirit and principles of the present disclosure shall be included in the protective scope of the present disclosure.

What is claimed is:

1. A display substrate assembly comprising:
   a base substrate;
   a light-shielding layer on the base substrate, the light-shielding layer having a plurality of light-shielding elements; and
   a plurality of polysilicon layers respectively on sides of the plurality of light-shielding elements away from the base substrate;
   wherein the plurality of light-shielding elements have different sizes such that energy lights reflected and/or refracted through the plurality of light-shielding elements of different sizes respectively generate different thermal energy distributions on the plurality of polysilicon layers corresponding to the plurality of light-shielding elements, causing the plurality of polysilicon layers to have different crystal forms,
   wherein the plurality of light-shielding elements comprise a first light-shielding element and a second light-shielding element, and the plurality of polysilicon layers comprise a first polysilicon layer on the first light-shielding element and a second polysilicon layer on the second light-shielding element; and
   size of the first light-shielding element is different from size of the second light-shielding element, and crystal form of the first polysilicon layer is different from crystal form of the second polysilicon layer,
   wherein the plurality of light-shielding elements further comprise a third light-shielding element, and the plurality of polysilicon layers further comprise a third polysilicon layer on the third light-shielding element; and
   size of the third light-shielding element is different from the size of the first light-shielding element, and crystal form of the third polysilicon layer is different from the crystal form of the first polysilicon layer,
   wherein the size of the first light-shielding element is equal to or less than 5 microns, and the size of the second light-shielding element and the size of the third light-shielding element are both greater than 5 microns; and
   the crystal form of the first polysilicon layer is a hexagonal crystal form. and the crystal form of the second polysilicon layer and the crystal form of the third polysilicon layer are both tetragonal crystal form.

2. The display substrate assembly of claim 1, wherein the first light-shielding element and the second light-shielding element are light-shielding blocks or light-shielding holes, and the third light-shielding element is light-shielding block.

3. The display substrate assembly of claim 1, further comprising:
   a buffer layer between the light-shielding layer and the plurality of polysilicon layers, or between the base substrate and the plurality of polysilicon layers.

4. The display substrate assembly of claim 1, wherein the base substrate has a display region for provision of a display element and a peripheral region for provision of a drive circuit, the peripheral region being located at least at a side of the display region; and the peripheral region contains the first polysilicon layer and the second polysilicon layer therein, and the display region contains the second polysilicon layer therein.

5. The display substrate assembly of claim 4, wherein the peripheral region further comprises: a gate drive circuit sub-region for provision of a gate drive circuit, and a source drive circuit sub-region for provision of a source drive circuit; and the gate drive circuit sub-region contains the first polysilicon layer therein, and the source drive circuit sub-region contains the second polysilicon layer therein.

6. The display substrate assembly of claim 4, wherein the display region further comprises: an infrared sensing sub-region for provision of an infrared sensor; and a third polysilicon layer is in the infrared sensing sub-region.

7. A method of manufacturing a display substrate assembly, the method comprising:

providing a base substrate;

forming a light-shielding layer on the base substrate, the light-shielding layer having a plurality of light-shielding elements; and forming a plurality of polysilicon layers respectively on sides of the plurality of light-shielding elements away from the base substrate;

wherein the plurality of light-shielding elements have different sizes such that energy lights reflected and/or refracted through the plurality of light-shielding elements of different sizes respectively generate different thermal energy distributions on the plurality of polysilicon layers corresponding to the plurality of light-shielding elements, causing the plurality of polysilicon layers to have different crystal forms, wherein the plurality of light-shielding elements comprise a first light-shielding element and a second light-shielding element, and the plurality of polysilicon layers comprise a first polysilicon layer on the first light-shielding element and a second polysilicon layer on the second light-shielding element; and size of the first light-shielding element is different from size of the second light-shielding element, and crystal form of the first polysilicon layer is different from crystal form of the second polysilicon layer, wherein the plurality of light-shielding elements further comprise a third light-shielding element, and the plurality of polysilicon layers further comprise a third polysilicon layer on the third light-shielding element; and size of the third light-shielding element is different from the size of the first light-shielding element and crystal form of the third polysilicon layer is different from the crystal form of the first polysilicon layer, wherein the size of the first light-shielding element is equal to or less than 5 microns, and the size of the second light-shielding element and the size of the third light-shielding element are greater than 5 microns; and the crystal form of the first polysilicon layer is a hexagonal crystal form, and the crystal form of the second polysilicon layer and the crystal form of the third polysilicon layer are tetragonal crystal forms.

8. The method of claim 7, wherein the first light-shielding element and the second light-shielding element are light-shielding blocks or light-shielding holes, and the third light-shielding element is light-shielding block.

9. The method of claim 7, further comprising:

forming, prior to forming the plurality of polysilicon layers respectively on the plurality of light-shielding elements, a buffer layer on the base substrate formed with the light-shielding layer; or forming, prior to forming the light-shielding layer on the base substrate, the buffer layer on the base substrate.

10. The method of claim 7, wherein the step of forming a plurality of polysilicon layers respectively on the plurality of light-shielding elements, further comprises:

forming a plurality of amorphous silicon layers on the base substrate formed with the plurality of light-shielding elements;

performing an annealing process on the plurality of amorphous silicon layers using an excimer laser annealing process, so that amorphous silicon in the plurality of amorphous silicon layers is converted into polysilicon; and performing a patterning process on the plurality of annealed amorphous silicon layers to obtain the plurality of poly silicon layers with different crystal forms.

11. The method of claim 10, wherein the step of performing a patterning process on the plurality of annealed amorphous silicon layers to obtain the plurality of poly silicon layers with different crystal forms, further comprises:

performing a single patterning process on the plurality of annealed amorphous silicon layers to form a first polysilicon layer and a second polysilicon layer on the first light-shielding element and the second light-shielding element, respectively; or performing a first patterning process on the annealed amorphous silicon layers to form the first polysilicon layer on the first light-shielding element, and performing a second patterning process on the annealed amorphous silicon layers to form the second polysilicon layer on the second light-shielding element.

12. The method of claim 7, wherein the base substrate has a display region for provision of a display element and a peripheral region for provision of a drive circuit, the peripheral region being located at least at a side of the display region;

the peripheral region further comprises: a gate drive circuit sub-region for provision of a gate drive circuit, and a source drive circuit sub-region for provision of a source drive circuit; and the gate drive circuit sub-region contains the first polysilicon layer therein, the source drive circuit sub-region contains the second polysilicon layer therein, and the display region contains the second polysilicon layer therein.

13. The method of claim 7, wherein the display region further comprises: an infrared sensing sub-region for provision of an infrared sensor; and the third polysilicon layer is in the infrared sensing sub-region.

14. A display apparatus comprising: a display substrate assembly wherein the display substrate assembly comprises: a base substrate; a light-shielding layer on the base substrate, the light-shielding layer having a plurality of light-shielding elements; and a plurality of polysilicon layers respectively on sides of the plurality of light-shielding elements away from the base substrate; wherein the plurality of light-shielding elements have different sizes such that energy lights reflected and/or refracted through the plurality of light-shielding elements of different sizes respectively generate different thermal energy distributions on the plurality of polysilicon layers corresponding to the plurality of light-shielding elements, causing the plurality of polysilicon layers to have different crystal forms;

wherein the plurality of light-shielding elements comprise a first light-shielding element and a second light-shielding element, and the plurality of polysilicon layers comprise a first polysilicon layer on the first light-shielding element and a second polysilicon layer on the second light-shielding element; and size of the first light-shielding element is different from size of the second light-shielding element, and crystal form of the first polysilicon layer is different from crystal form of the second polysilicon layer, wherein the plurality of light-shielding elements further comprise a third light-shielding element, and the plurality of polysilicon layers further comprise a third polysilicon layer on the third light-shielding element; and size of the third light-shielding element is different from the size of the first light-shielding element, and crystal form of the third polysilicon layer is different from the crystal form of the first polysilicon layer, wherein the size of the first light-shielding element is equal to or less than 5 microns, and the size of the second light-shielding element and the size of the third light-shielding element are greater than 5 microns; and the crystal form of the first polysilicon layer is a hexagonal crystal form, and the crystal form of the second polysilicon layer and the crystal form of the third polysilicon layer are tetragonal crystal forms.

* * * * *